United States Patent
Teo et al.

(10) Patent No.: US 8,921,710 B2
(45) Date of Patent: Dec. 30, 2014

(54) ELECTROMAGNETIC SHIELDING CONFIGURATION

(75) Inventors: Tat Ming Teo, Singapore (SG); Jinxiang Liu, Singapore (SG)

(73) Assignee: Finisar Corporation, Sunnyvale, CA (US)

(*) Notice: Subject to any disclaimer, the term of this patent is extended or adjusted under 35 U.S.C. 154(b) by 184 days.

(21) Appl. No.: 13/595,906

(22) Filed: Aug. 27, 2012

(65) Prior Publication Data

US 2012/0318573 A1 Dec. 20, 2012

Related U.S. Application Data

(63) Continuation of application No. 12/616,060, filed on Nov. 10, 2009, now Pat. No. 8,253,037.

(30) Foreign Application Priority Data

Nov. 10, 2008 (SG) .................................. 200808378

(51) Int. Cl.
*H05K 9/00* (2006.01)
(52) U.S. Cl.
CPC .................................. *H05K 9/0009* (2013.01)
USPC .......................................... 174/363; 174/384

(58) Field of Classification Search
CPC .................................................... H05K 9/0009
USPC .................... 174/363, 364, 384, 372; 361/816
See application file for complete search history.

(56) References Cited

U.S. PATENT DOCUMENTS

| | | | | |
|---|---|---|---|---|
| 5,170,009 A | * | 12/1992 | Kadokura | 174/363 |
| 7,687,725 B2 | * | 3/2010 | Hogan | 174/367 |
| 7,910,839 B2 | * | 3/2011 | Lynam | 174/369 |
| 8,039,763 B1 | * | 10/2011 | Cochrane | 174/377 |
| 2008/0310086 A1 | * | 12/2008 | Akama et al. | 361/679 |

* cited by examiner

*Primary Examiner* — Hung V Ngo
(74) *Attorney, Agent, or Firm* — Maschoff Brennan

(57) ABSTRACT

An electromagnetic shielding configuration comprising a first electrically conductive wall having a first surface and a second electrically conductive wall having a second surface. The first surface is oppositely disposed from the second surface, wherein interfacing of the first conductive wall and the second conductive wall forms an enclosure wall. The first surface comprises at least one stepped edge forming a plurality of surfaces of unequal lateral displacement, and a corrugated surface on at least one of the plurality of surfaces, the corrugated surface formed by a series of apices extending radially from the first surface. The second surface is substantially a conjugate of the first surface.

20 Claims, 9 Drawing Sheets

ELECTROMAGNETIC SHIELDING CONFIGURATION

CROSS-REFERENCE TO RELATED APPLICATIONS

This patent application is a continuation of U.S. patent application Ser. No. 12/616,060, filed Nov. 10, 2009 and which claims the benefit of Singapore Patent Application No. 200808378-4, filed on Nov. 10, 2008, each of which is hereby incorporated by reference as if fully set forth herein.

BACKGROUND

1. Field of the Invention

The present invention relates to the field of shielding electromagnetic interference through the use of electrically conductive shells or casings.

2. Related Technology

As the trend for electronics and electrical devices continue to move towards miniaturization, the effects of electromagnetic interference due to electromagnetic radiation continue to become more profound. This interference can be highly disruptive to an integrated circuit as it can distort the signals carried within the circuit, thereby adversely impacting its performance. This problem is exacerbated in high frequency applications such as those in the field of communications that are becoming far more prevalent today.

In general, steps taken to address this problem are usually applied directly on the circuitry through means such as the use of bypass capacitors, the slowing of rise and fall times as well as minimizing noise from ground and supply lines. However, in today's technology where many high-speed components are often clustered together in small, densely packed applications, these solutions remain inferior. Another solution is the use of electromagnetic shielding. An electromagnetic shield can be employed to contain electromagnetic radiation emitted from an electromagnetic source, as well as to protect sensitive circuitry by shielding it from electromagnetic interference.

In order to reduce the effects of electromagnetic interference, the shields are usually able to absorb and/or reflect electromagnetic interference energy, and are often presented in the form of enclosures comprising of electrically grounded conductive walls that act as a barrier for electromagnetic interference and electromagnetic radiation. These walls are usually made of metal or conductively painted plastic, and can sometimes involve the use of conductive gaskets in the sealing of the enclosure. Since there is a need for circuitry to be accessible, it is advantageous for the enclosure to be of a semi-temporal nature, and this is often implemented through the use of access panels, doors and the like. However, the use of such accesses also leads to diminished electromagnetic shielding as they invariably lead to seams between the removable accesses and the enclosure, which provide an opening in which electromagnetic radiation may enter into or escape from the enclosure. These gaps can also disrupt the ground conduction path and in the case of a Faraday cage, inhibit the electromagnetic shielding of the cage through the electrical discontinuities caused by the gaps between the electrically conductive walls of the enclosure. Much of the prior art is hence centered on the minimization of these openings and the resulting electromagnetic radiation and/or electromagnetic interference.

One way of doing so is through the use of gaskets. However, the use of gaskets can be costly as they are required to be wear resistant and capable of withstanding repeated compression and relaxation cycles, and adds to the manufacturing cost by increasing the inventory management and product cycle time. The use of gaskets may also necessitate their replacement occasionally due to corrosion and/or the loss of compressibility, which further adds to the cost.

Other prior art solutions attempt to minimize the gap in the enclosures by utilizing mechanical means to secure the access panels and the like to achieve a seamless enclosure while maintaining good electrical conductivity throughout the enclosure. However, the nature of such designs is such that there still remain seams between the joints regardless of the mechanical pressure applied in joining these parts due to the unavoidable tolerances in the manufacturing process, causing imperfections in the fabricated parts and surfaces. This results in less than ideal joints between mating surfaces.

One way of improving the electromagnetic shielding of an enclosure without the weaknesses of the above solutions is by designing a step along its walls, as illustrated cross-sectionally in FIG. 1. This step reduces the electromagnetic radiation by introducing a perpendicular turn (104) at the interface of the top (102) and bottom (103) enclosure walls, which weakens the energy of the transmitter radiation by having the geometrical interference absorb it. This solution also has its disadvantages. First, the design is susceptible to electromagnetic radiation polarized in a direction parallel to the opening of the steps. Second, due to tolerances allowed in the fabrication process, any rounding of the edges of the steps would allow electromagnetic radiation (101) to pass through the gaps by bending past the edges. Third, design constraints, particularly in communications modules, often limits the thickness of the walls to be used for the shielding enclosure. In thin walls, the geometrical interference provided by the steps may not be sufficient to attenuate the electromagnetic radiation to minimize the interference caused.

The use of an electromagnetic interference paste to seal the gaps might be sufficient to address the weaknesses inherent in the respective prior art. There are several disadvantages in this. First, the use of electromagnetic interference paste increases cost, both in the sale of the paste and the processing cost involved in dispensing the paste onto the interfacing joints. Second, the use of electromagnetic interference paste necessitates the need for curing, which requires additional time and effort in the application of heat and increases the product cycle time further.

SUMMARY OF SOME EXAMPLE EMBODIMENTS

One embodiment is an electromagnetic shielding configuration comprising a first electrically conductive wall having a first surface and a second electrically conductive wall having a second surface. The first surface is oppositely disposed from the second surface, wherein the interfacing of the first conductive wall and the second conductive wall forms an enclosure wall. The first surface comprises at least one stepped edge forming a plurality of surfaces of unequal lateral displacement, and a corrugated surface on at least one of the plurality of surfaces, the corrugated surface formed by a series of apices extending radially from the first surface. The second surface is substantially a conjugate of the first surface.

The present invention consists of several novel features and a combination of parts hereinafter fully described and illustrated in the accompanying drawings, it being understood that various changes in the details may be made without departing from the scope of the invention.

These and other embodiments and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF SOME EXAMPLE EMBODIMENTS

Embodiments of the invention relate to an electromagnetic shielding configuration for an electromagnetic shield enclosure. Hereinafter, this specification will describe the present invention according to some example embodiments. However, it is to be understood that limiting the description to the example embodiments of the invention is merely to facilitate discussion of the present invention and it is envisioned that those skilled in the art may devise various modifications and equivalents without departing from the scope of the appended claims.

In some embodiments, an electromagnetic shielding configuration for an electromagnetic shield enclosure comprises a first conductive wall and a second conductive wall, wherein the first conductive wall has a first surface and the second conductive wall has a second surface. The first surface is oppositely disposed from the second surface such that an enclosure wall is formed when the first conductive wall is interfaced with the second conductive wall whereby the space between the first surface and the second surface is minimal to provide for a reduction of electromagnetic interference.

In some embodiments, the first surface comprises a corrugated surface and the second surface is substantially a conjugate of the first surface. The corrugated surface of the first surface is formed by a series of apices extending radially from the first surface. The second surface is shaped to be substantially a conjugate of the first surface to provide for minimal spacing between the first surface and the second surface during interfacing of the first conductive wall and the second conductive wall to form the enclosure wall. The corrugated surface may either be shaped as a serrated edge surface, an interlocking rectangular surface, or the like. For an interlocking rectangular surface, a corrugated surface may comprise of a series of stepped ledges forming planar surfaces of alternating lateral displacement, each of which is perpendicular to the surface of the enclosure wall.

For an enclosure wall having sufficient thickness, the corrugated surface may be designed to comprise a plurality of ridges parallel to the surface of the enclosure wall. For example, FIG. 2 is an illustration of an electromagnetic shielding configuration comprising a corrugated surface having ridges that are substantially parallel to the surface of the enclosure wall.

Figure 1:
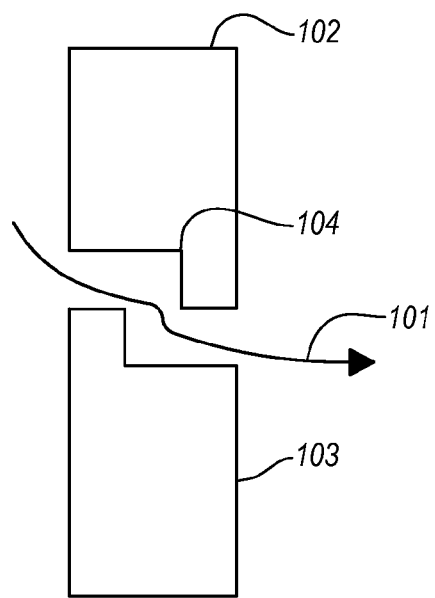
FIG. 1 is an illustration of a prior art configuration using a stepped ledge along an enclosure wall.
Figure 2:
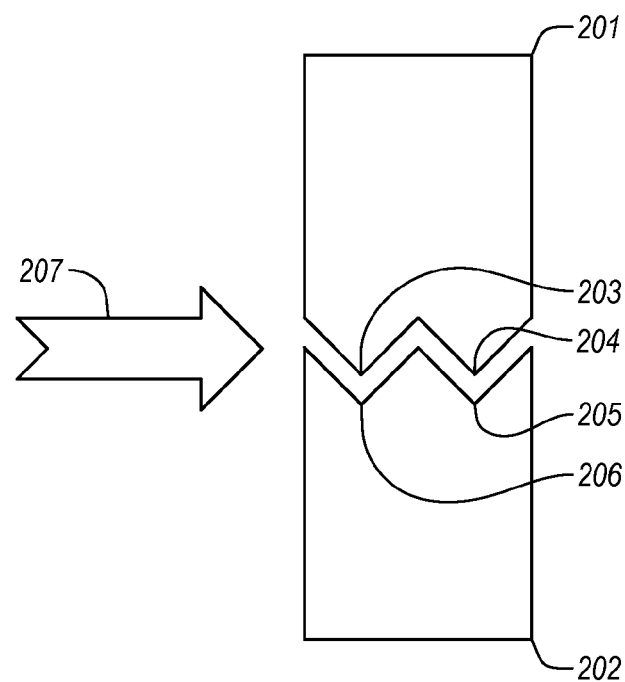
FIG. 2 is an illustration of an electromagnetic shielding configuration comprising a corrugated surface having ridges that are parallel to the surface of the enclosure wall.

In FIG. 2, an electrically conductive first wall (201) is depicted in a cross-sectional side view interfacing with the electrically conductive conjugate second wall (202) of which one of the two is electrically grounded to form an enclosure wall of an electromagnetic shielding enclosure. Alternatively, the first wall (201) may be shorted to the second wall (202) by contacting one another. The first wall (201), second wall (202) or both walls (201, 201) in this configuration may be electrically grounded.

The first surface of first wall (201) comprises a corrugated surface shaped as a serrated edge surface wherein apices (203, 204) are formed by saw tooth protuberances on the first surface of the first wall (201). The apices (203, 204) are conjugate with indentations (205, 206) on the second surface of the second wall (202), the second surface also comprising a corrugated surface. The apices (203, 204) and indentations (205, 206) are formed such that the corrugated surfaces of the first wall (201) and second wall (202) comprise ridges that extend in parallel to the surface of the enclosure wall.

Electromagnetic radiation (207) is directed perpendicularly to the surface of the enclosure wall formed by the first wall (201) and the second wall (202). The enclosure wall provides geometrical indentations along the serrated edges to absorb the energy of horizontally polarized electromagnetic radiation.

Figure 3:
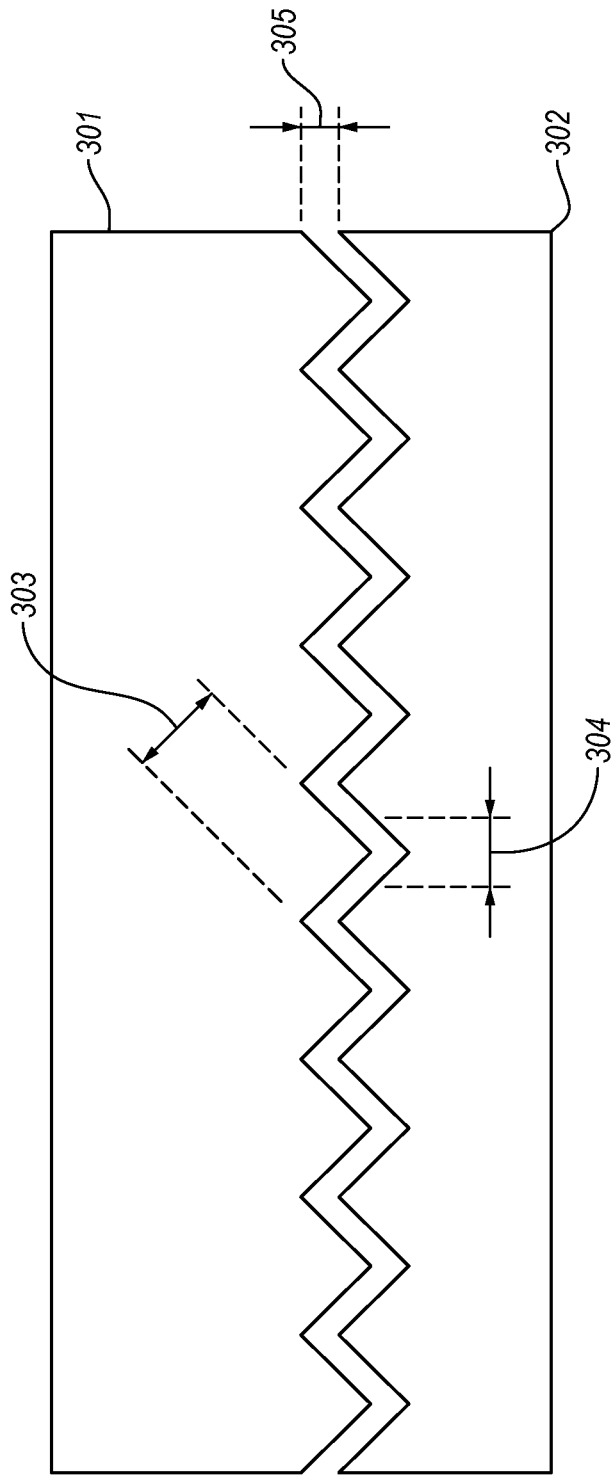
FIG. 3 is an illustration of an electromagnetic shielding configuration comprising a corrugated surface having ridges that are perpendicular to the surface of the enclosure wall.

Alternatively, if the enclosure wall does not have sufficient thickness, as minimal thickness is, more often than not, required in electromagnetic shielding, the implementation of ridges parallel to the surface of the enclosure wall may be impractical. As such, the corrugated surface may be designed to comprise a plurality of ridges that are substantially perpendicular to the surface of the enclosure wall. FIG. 3 is an illustration of an electromagnetic shielding configuration comprising a corrugated surface having ridges that are substantially perpendicular to the surface of the enclosure wall.

Referring to FIG. 3, an electrically conductive first wall (301) is depicted in a plan view interfacing with an electrically conductive conjugate second wall (302) of which one of the two is electrically grounded to form an enclosure wall of an electromagnetic shielding enclosure.

The first surface of first wall (301) comprises a corrugated surface shaped as a serrated edge surface wherein apices are formed by saw tooth protuberances on the first surface of the first wall (301). The apices are conjugate with indentations on the second surface of the second wall (302), the second surface also comprising a corrugated surface. However, in this embodiment, the apices and indentations are formed such that the corrugated surfaces on the first wall (301) and the second wall (302) comprise ridges that extend substantially normal to the surface of the enclosure wall.

Due to practical limitations in the manufacturing of such electromagnetic shielding, several openings (303, 304, 305) in the serrated edges may often be present in the interfacing of the first and second walls (301, 302). As a general rule, an opening should not be wider than 1/20 of the ratio of speed of light in air to data rate of a device in which the enclosure wall is to be used in order to effectively prevent electromagnetic radiation from passing through. As illustrated in FIG. 3, comparing the horizontal opening (304), vertical opening (305) and the diagonal opening (303), this design may be more susceptible to diagonally polarized electromagnetic radiation as the diagonal opening (303) is the largest. In such designs, the angles of the diagonal edges of the conjugate surfaces of the first and second walls can be varied such that the diagonal opening (303) presents the smallest distance possible.

In another example embodiment, the first surface of the first wall comprises at least one stepped edge forming a plurality of surfaces that are substantially perpendicular or angled relative to a surface of the enclosure wall and a corrugated surface on at least one of the plurality of surfaces, where the second surface of the second wall is a conjugate of the first surface. The first surface may comprise one stepped edge and two surfaces of unequal lateral displacement. The corrugated surface of the first surface can be formed by a series of apices extending radially from the first surface. The second surface is shaped to be a substantial conjugate of the first surface to provide for minimal spacing between the first surface and the second surface during interfacing of the first conductive wall and the second conductive wall to form the enclosure wall.

The corrugated surfaces of the first wall and the second wall can comprise a plurality of ridges that are substantially parallel, substantially perpendicular or otherwise inclined to the surface of the enclosure wall, depending on the thickness of the enclosure wall. If the enclosure wall has sufficient thickness, the corrugated surface may comprise a plurality of ridges parallel to the surface of the enclosure wall. However, if the enclosure wall does not have sufficient thickness, the corrugated surface may comprise a plurality of ridges perpendicular to the surface of the enclosure wall. The corrugated surface may be shaped as a serrated edge surface, an interlocking rectangular surface, or the like.

Figure 4:
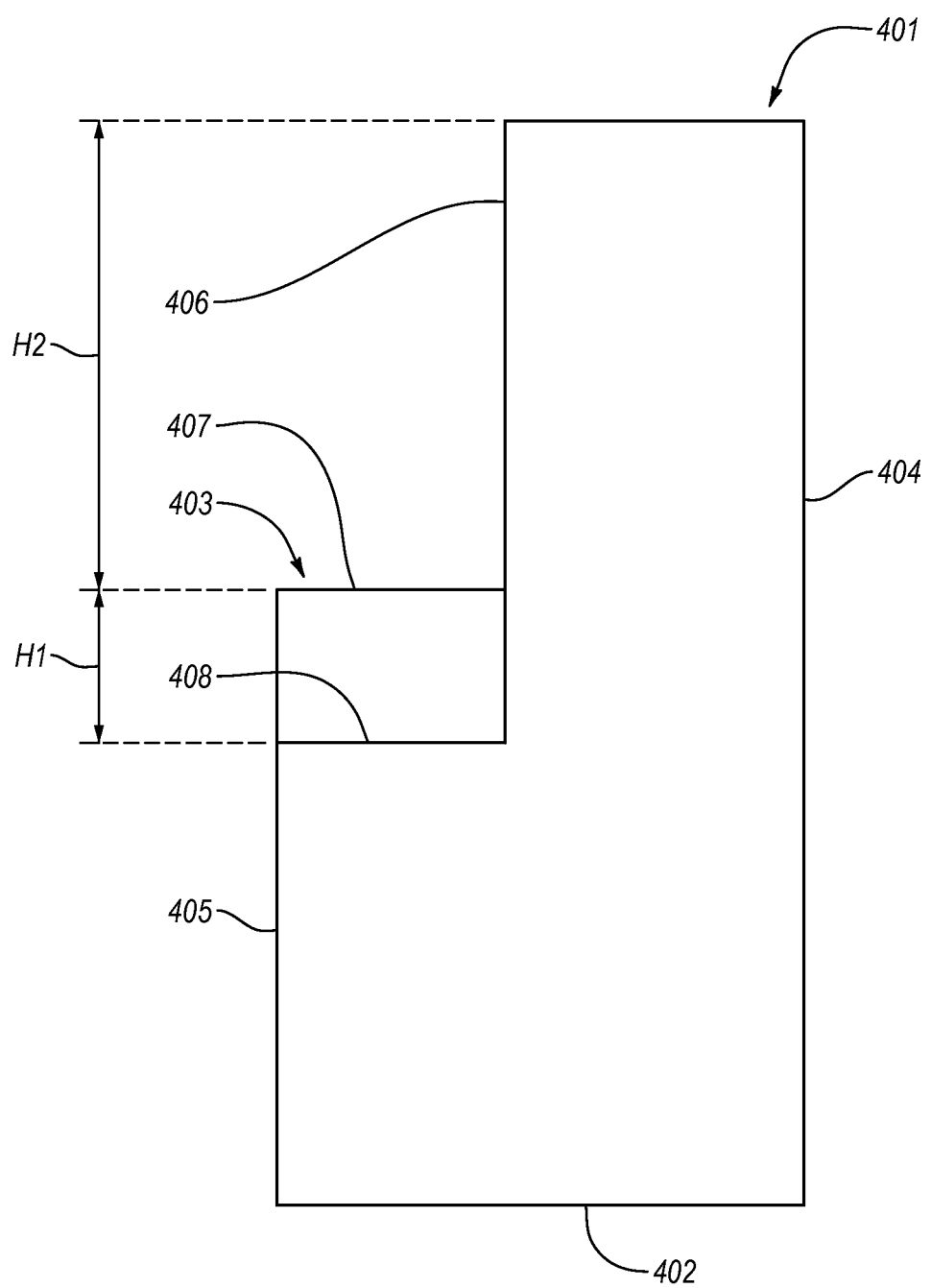
FIG. 4 is an illustration of an electromagnetic shielding configuration comprising a stepped ledge employed concurrently with a corrugated surface.
Figure 5:
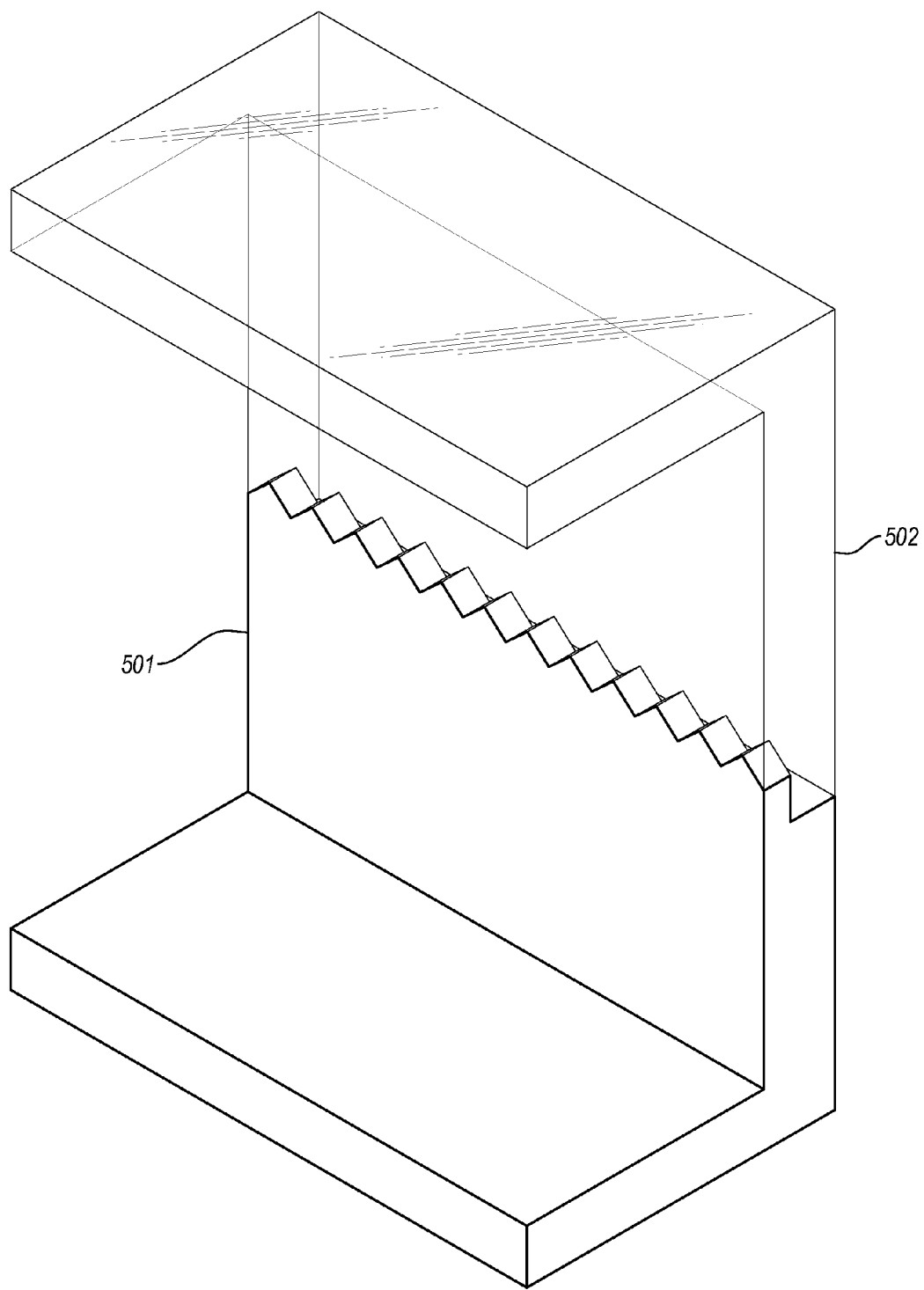
FIG. 5 is a perspective view of the electromagnetic shielding configuration of FIG. 4.

FIG. 4 is an illustration of a portion of an electromagnetic shielding configuration comprising a stepped ledge employed concurrently with a corrugated surface. FIG. 5 is a perspective view of the electromagnetic shielding configuration comprising the stepped ledge employed concurrently with the corrugated surface.

Reference is now being made to FIG. 4. In FIG. 4, the electromagnetic shielding configuration provides shielding against diagonally polarized electromagnetic radiation, as well as against electromagnetic radiation with other polarizations that passes through diagonal openings. Shielding is achieved by employing a stepped ledge concurrently with a corrugated surface. First wall (402) comprises a first surface having one stepped surface (406) and two surfaces (401, 403) of unequal lateral displacement.

Surface (401) is a flat surface whereas surface (403) is a corrugated surface. The flat surface (401) is formed in parallel with the ridges of the corrugated surface (403). The flat surface (401) lies substantially perpendicularly adjacent to a surface (404) of the enclosure wall and to the stepped surface (406), while corrugated surface (403) lies substantially perpendicularly adjacent to the opposing surface (405) of the enclosure wall and to the stepped surface (406). As disclosed in FIG. 4, the corrugated surface (403) includes a series of apices (407) (only one apex (407) is shown in FIG. 4) extending from a base (408) of the corrugated surface (403). Also disclosed in FIG. 4, the height H1 of the corrugations between the base (408) and the apices (407) is less than the height H2 of the stepped surface (406) between the apices (407) and the flat surface (401). The first wall (402) interfaces with the second wall (not shown), the second wall having a second surface shaped to be a conjugate of the first surface of the first wall (402) to provide for minimal spacing between the first surface and the second surface as shown in FIG. 5.

Reference is now being made to FIG. 5. In FIG. 5, electromagnetic radiation originating from the inside of the enclosure wall (501) would likely be diagonally polarized by the diagonal openings in the serrated edges of the interfacing corrugated surface. This diagonal polarization is in a direction parallel to the sloping edges of the serrated edge since such diagonal openings are relatively large compared to vertical and horizontal openings of the interfacing corrugated surface. A vertical barrier is provided by the stepped ledge to block this diagonally polarized electromagnetic radiation.

Similarly, electromagnetic radiation originating from outside the enclosure wall (502) would likely be horizontally polarized in parallel to the ledge of the stepped edge. This horizontally polarized electromagnetic radiation will be blocked by the corrugated surface as this configuration ensures much smaller horizontal openings as compared to the diagonal openings.

The electromagnetic shielding configuration of FIGS. 4 and 5 effectively acts as a dual stage filter in which a first stage may allow electromagnetic waves polarized in a certain direction to pass while the second stage minimizes the chances of these directionally polarized waves to pass, providing for a reduction of electromagnetic interference.

Figure 6:
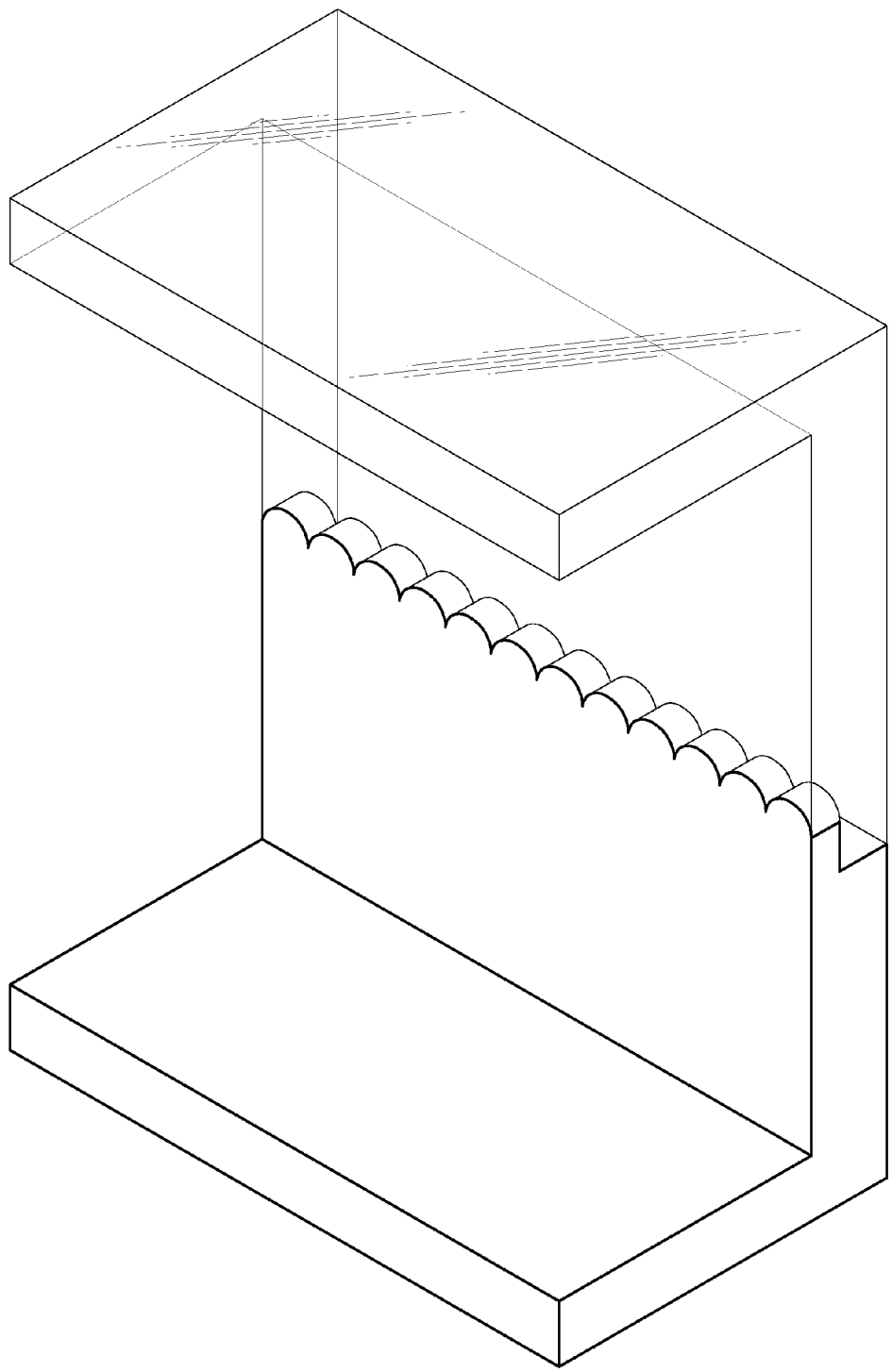
FIG. 6 is an illustration of an electromagnetic shielding configuration comprising a stepped ledge employed concurrently with a corrugated surface, wherein the corrugated surface comprises a series of semicircular arcs.
Figure 7:
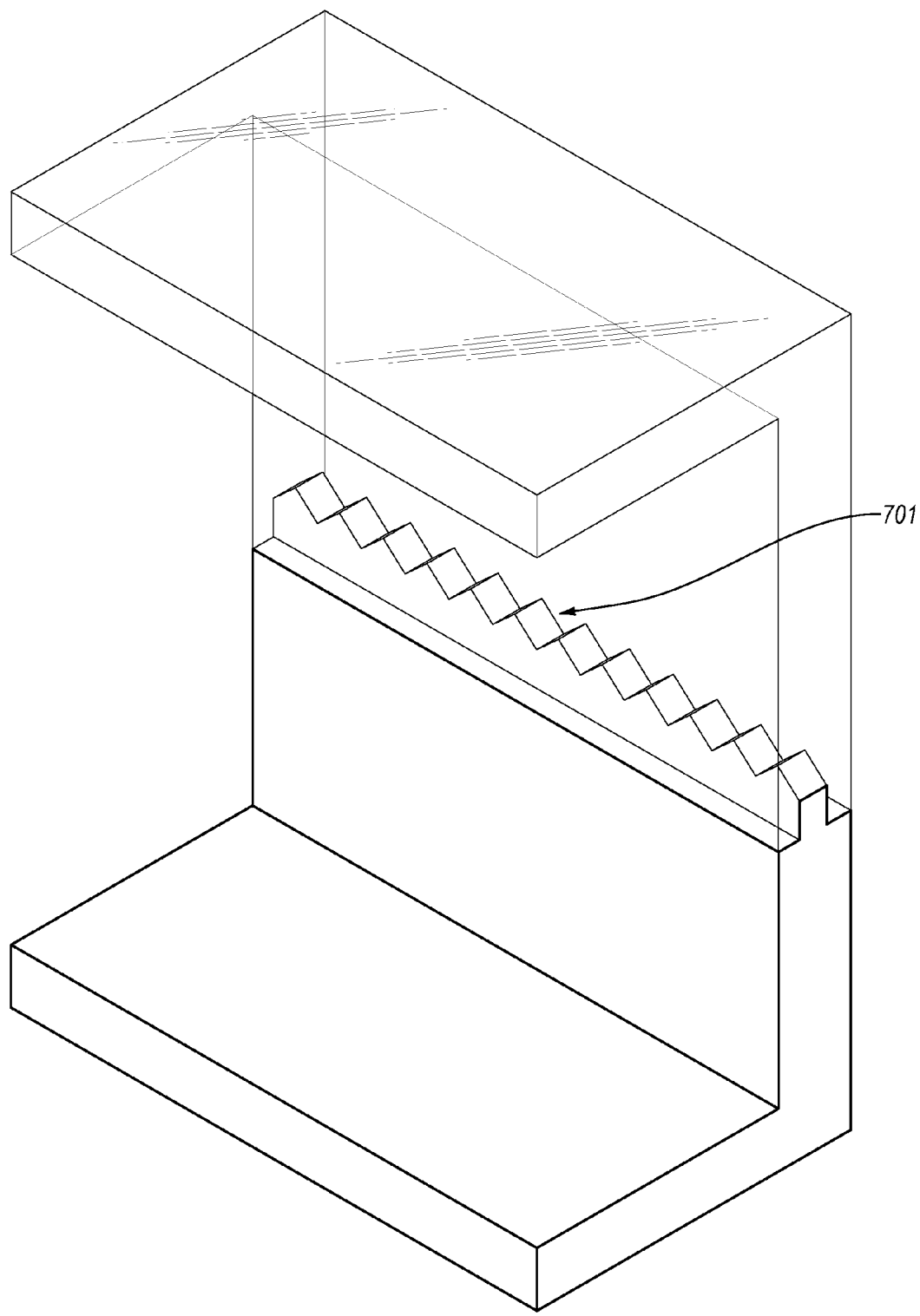
FIG. 7 is an illustration of an electromagnetic shielding configuration comprising two stepped ledges forming three surfaces of unequal lateral displacement, wherein the middle surface is a serrated edge surface.

The interfacing corrugated surface is not restricted to a serrated edge. With reference to FIG. 6, a series of semicircular arcs are disclosed that can alternately be implemented in place of the serrated edges. Similar to the configuration of FIG. 5, the configuration of FIG. 6 also acts like a dual stage filter whereby a first stage, be it the vertical step or semicircular arcs, polarizes the electromagnetic radiation in a particular direction that can be filtered by the second stage.

Where the width of the enclosure wall is not an issue, the number of surfaces may be delimited in order to accommodate as many as necessary. With reference to FIG. 7, a configuration is disclosed comprising three surfaces that are substantially perpendicular to the surface of the enclosure; these surfaces lie in series and the middle surface is shaped as a serrated edge (701).

Figure 8:
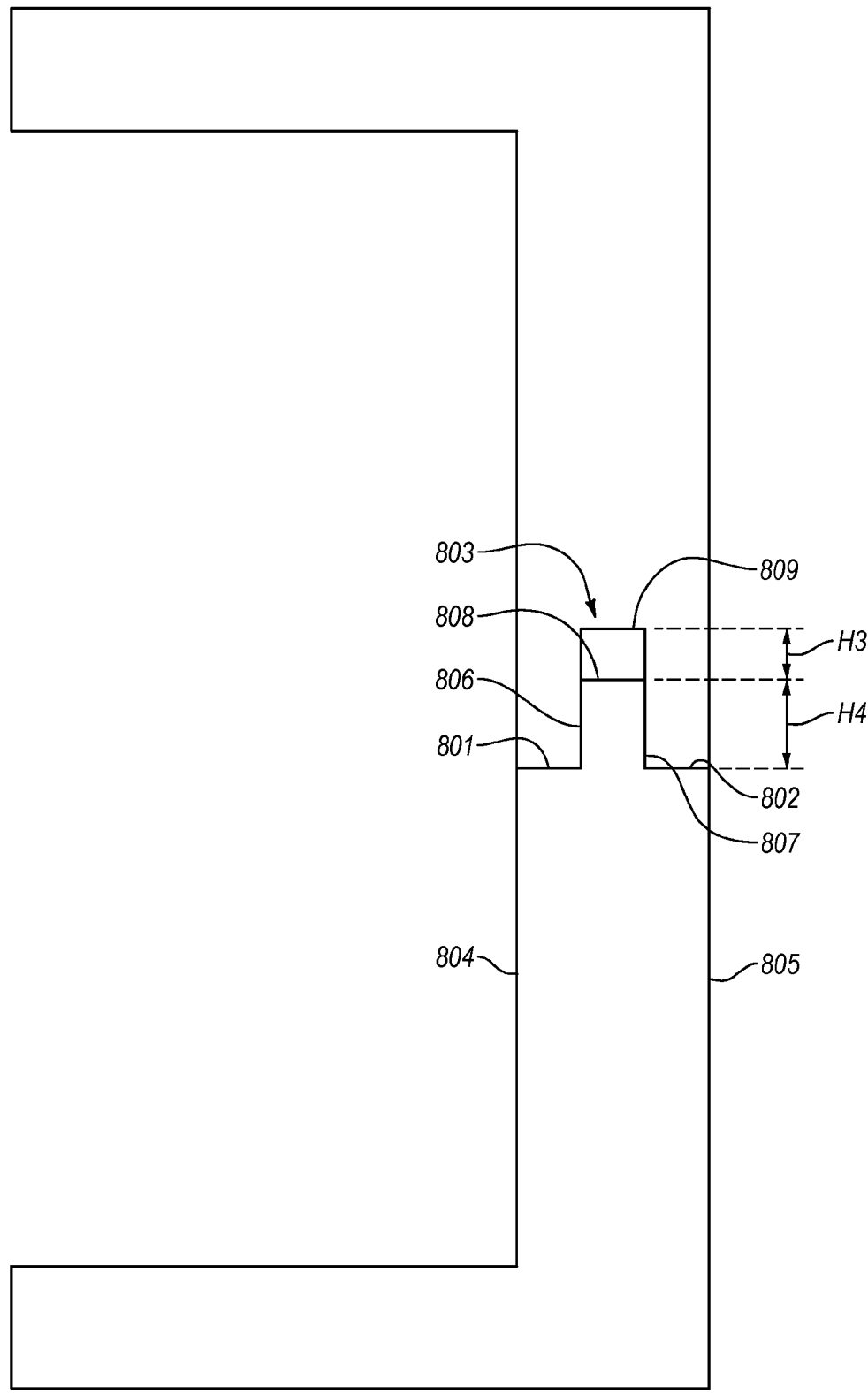
FIG. 8 is a cross-sectional view of the electromagnetic shielding configuration of FIG. 7.

Turning to FIG. 8, a cross sectional view of an electromagnetic shielding configuration is disclosed that may correspond to the configuration of FIG. 7. The configuration of FIG. 8 includes middle corrugated surface (803), two surfaces (801, 802) that are substantially parallel to one another, and two stepped surfaces (806, 807). The middle surface (803) is of an unequal lateral displacement with respect to the two surfaces (801, 802). In turn, surfaces (801, 802) directly adjoin and are perpendicular to inner and outer walls (804, 805) of the enclosure, respectively. In addition, surfaces (801, 802) directly adjoin and are perpendicular to two stepped surfaces (806, 807), respectively. As disclosed in FIG. 8, the middle corrugated surface (803) includes a series of apices (808) (only one apex (808) is shown in FIG. 8) extending from a base (809) of the corrugated surface (803). Also disclosed in FIG. 4, the height H3 of the corrugations between the base (809) and the apices (808) is less than the height H4 of the stepped surfaces (806, 807) between the apices (808) and the surfaces (801, 802). Compared to the configurations of FIGS. 4-6, the configuration of FIG. 8 provides an additional vertical barrier to block polarized electromagnetic radiation.

Figure 9:
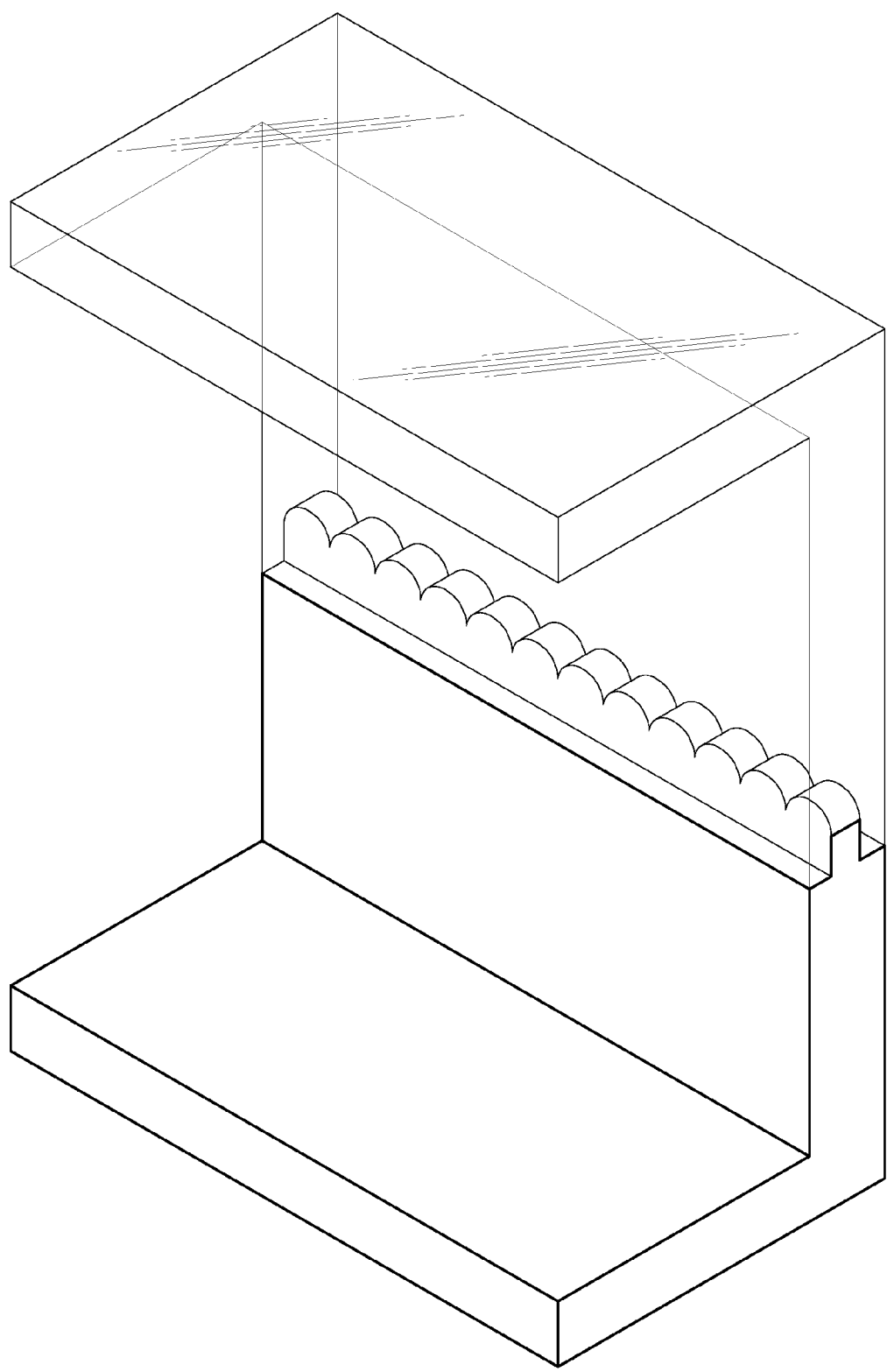
FIG. 9 is an illustration of an electromagnetic shielding configuration comprising two stepped ledges forming three surfaces of unequal lateral displacement, wherein the middle surface comprises a series of semicircular arcs.

Alternately, a series of semicircular arcs as used in FIG. 6 can also be used in place of the serrated edges of FIGS. 7 and 8. One such embodiment is shown in FIG. 9, which illustrates an electromagnetic shielding configuration comprising two stepped ledges forming three surfaces of unequal lateral displacement, wherein the middle surface comprises a series of semicircular arcs. Similar to the configurations of FIGS. 7 and 8, the configuration of FIG. 9 minimizes the amount of electromagnetic radiation that can pass through the enclosure wall.

Figure 10:
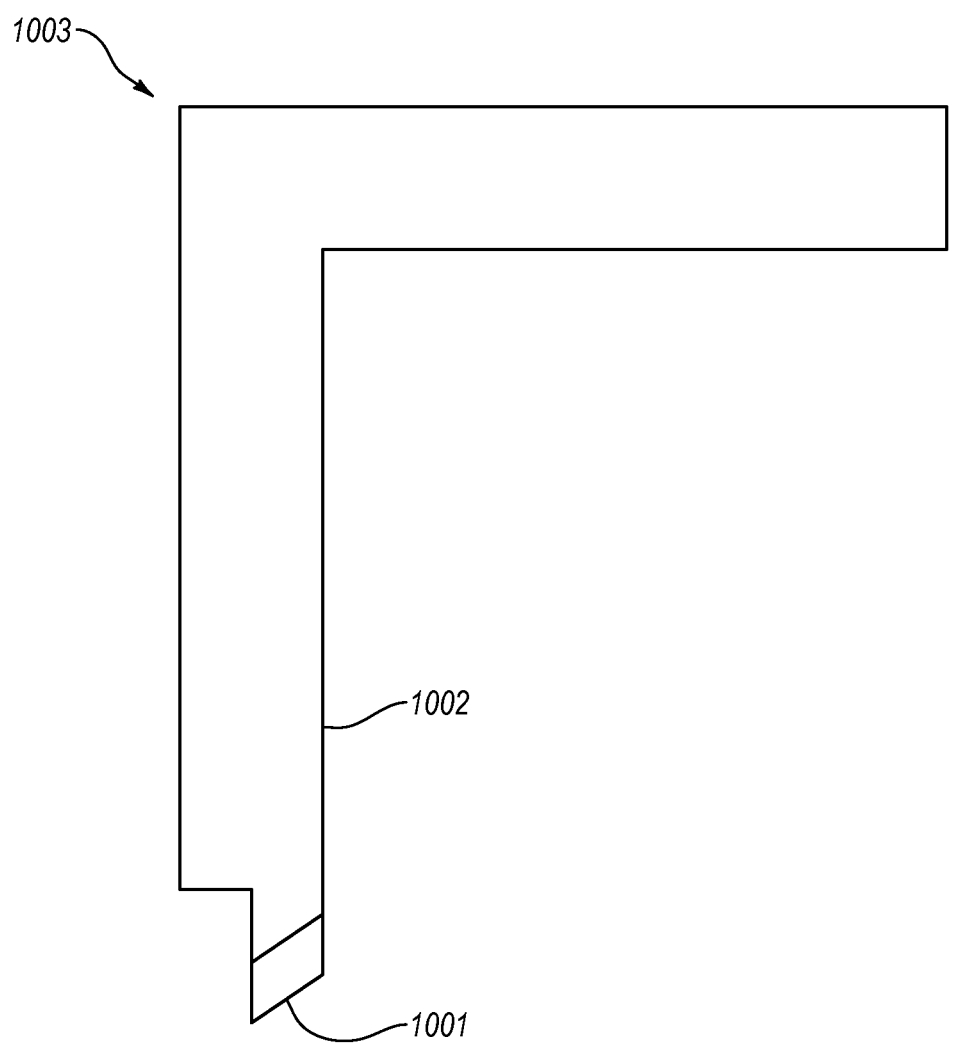
FIG. 10 is an illustration of an electromagnetic shielding configuration comprising a corrugated surface having ridges that are sloped relative to the surface of the enclosure wall.

Although embodiments of the invention have been described in the context of interfacing surfaces that are substantially perpendicular to the enclosure wall and/or serrated edge surface ridges that are substantially perpendicular or substantially parallel to the enclosure wall, embodiments of the invention alternately or additionally include interfacing surfaces and/or serrated edge surface ridges that are angled/inclined relative to the enclosure wall. For instance, FIG. 10 discloses an electromagnetic shielding configuration comprising a first wall (1003) including a stepped edge and serrated edge surface ridges (1001) (only one serrated edge surface ridge (1001) is shown in FIG. 10) that are inclined relative to enclosure wall surface (1002). As disclosed in FIG. 10, each of the apices of the ridges (1001) is angled at a non-perpendicular angle relative to the enclosure wall surface (1002). Although not shown, the configuration of FIG. 10 further comprises a second wall that is a substantial conjugate of the first wall (1003).

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope. All references (e.g., publications, journal articles, published patent application, patents, and the like) are incorporated herein by specific reference in their entirety.

What is claimed is:

1. An electromagnetic shielding configuration comprising:
a first electrically conductive wall having a first edge; and
a second electrically conductive wall having a second edge that is substantially a conjugate of the first edge, the first edge being oppositely disposed from the second edge and the interfacing of the first edge and the second edge forming an enclosure wall,
wherein:
the first edge comprises a raised surface that is substantially flat, a stepped surface substantially perpendicular and adjacent to the raised surface, and a corrugated surface substantially perpendicular and adjacent to the stepped surface and laterally displaced from the raised surface, the corrugated surface comprising a series of apices extending from a base of the corrugated surface, the height of the corrugations between the base and the apices being less than the height of the stepped surface between the apices and the raised surface;
the first edge is configured to interface with the second edge to form a two stage filter;
the two stage filter includes a first stage configured to polarize electromagnetic radiation and a second stage configured to block the polarized electromagnetic radiation; and
one of the first stage and the second stage includes a vertical barrier having the height of the stepped surface between the apices and the raised surface.

2. An electromagnetic shielding configuration according to claim 1, wherein the first edge forms an intimate continuous contact with the second edge during the interfacing of the first conductive wall and the second conductive wall.

3. An electromagnetic shielding configuration according to claim 1, wherein the corrugated surface comprises a plurality of ridges that are substantially perpendicular to the enclosure wall.

4. An electromagnetic shielding configuration according to claim 1, wherein the corrugated surface is a serrated edge surface.

5. An electromagnetic shielding configuration according to claim 1, wherein the corrugated surface is an interlocking rectangular surface.

6. An electromagnetic shielding configuration according to claim 1, wherein the corrugated surface comprises of a series of semicircular arcs.

7. An electromagnetic shielding configuration according to claim 1, wherein the first wall is electrically grounded.

8. An electromagnetic shielding configuration according to claim 1, wherein the first wall is shorted to the second wall.

9. An electromagnetic shielding configuration comprising:
a first electrically conductive wall having a first edge;
a second electrically conductive wall having a second edge that is substantially a conjugate of the first edge, the first edge being oppositely disposed from the second edge and the interfacing of the first edge and the second edge forming an enclosure wall,
wherein:
the first edge comprises a raised surface that is substantially flat, a stepped surface substantially perpendicular and adjacent to the raised surface, and a corrugated surface comprising a series of apices extending from a base of the corrugated surface, each of the apices being at an incline relative to the enclosure wall, wherein the incline relative to the enclosure wall is a non-perpendicular angle;
the first edge is configured to interface with the second edge to form a two stage filter;
the two stage filter includes a first stage configured to polarize electromagnetic radiation and a second stage configured to block the polarized electromagnetic radiation; and
one of the first stage and the second stage includes a vertical barrier having a height of the stepped surface between the apices and the raised surface.

10. An electromagnetic shielding configuration according to claim 9, wherein the first edge forms an intimate continuous contact with the second edge during the interfacing of the first conductive wall and the second conductive wall.

11. An electromagnetic shielding configuration according to claim 9, wherein the corrugated surface comprises a plurality of ridges that are substantially perpendicular to the surface of the enclosure wall.

12. An electromagnetic shielding configuration according to claim 9, wherein the corrugated surface is a serrated edge surface.

13. An electromagnetic shielding configuration according to claim 12, wherein the interfacing of the first edge and the second edge forming the enclosure wall defines openings.

14. An electromagnetic shielding configuration according to claim 13, wherein the openings are less than about 1/20th of the ratio of a speed of light in air to the data rate of a device implementing the electromagnetic shielding configuration.

15. An electromagnetic shielding configuration according to claim 9, wherein the corrugated surface is an interlocking rectangular surface.

16. An electromagnetic shielding configuration according to claim 9, wherein the corrugated surface comprises a series of semicircular arcs.

17. An electromagnetic shielding configuration comprising:
   a first electrically conductive wall having a first edge; and
   a second electrically conductive wall having a second edge that is substantially a conjugate of the first edge, the first edge being oppositely disposed from the second edge and the interfacing of the first edge and the second edge forming an enclosure wall,
   wherein the first edge comprises:
      a first raised surface;
      a second raised surface substantially parallel to the first raised surface;
      a middle corrugated surface positioned between and laterally displaced from the first and second raised surfaces and comprising a series of apices extending from a base of the corrugated surface;
      a first stepped surface substantially perpendicular and adjacent to both the first raised surface and the corrugated surface; and
      a second stepped surface adjacent and perpendicular to both the corrugated surface and the second raised surface,
   wherein the height of the corrugations between the base and the apices is less than the height of the first stepped surface between the apices and the first raised surface.

18. An electromagnetic shielding configuration according to claim 17, wherein the corrugated surface is a serrated edge surface.

19. An electromagnetic shielding configuration according to claim 18, wherein the first wall is shorted to the second wall.

20. An electromagnetic shielding configuration according to claim 19, wherein the interfacing of the first edge and the second edge forming the enclosure wall defines openings, wherein the openings are less than about 1/20th of the ratio of a speed of light in air to the data rate of a device implementing the electromagnetic shielding configuration.

* * * * *

UNITED STATES PATENT AND TRADEMARK OFFICE
CERTIFICATE OF CORRECTION

PATENT NO. : 8,921,710 B2  Page 1 of 1
APPLICATION NO. : 13/595906
DATED : December 30, 2014
INVENTOR(S) : Tat Ming Teo et al.

It is certified that error appears in the above-identified patent and that said Letters Patent is hereby corrected as shown below:

In the specification,

Column 1, Line 8, delete "2009 and" and insert -- 2009, now Pat. No. 8,253,037 and --, therefor.

Column 4, Line 32, delete "(201, 201)" and insert -- (201, 202) --, therefor.

Signed and Sealed this
Twenty-seventh Day of October, 2015

Michelle K. Lee
*Director of the United States Patent and Trademark Office*